United States Patent [19]

Hineno et al.

[11] Patent Number: 4,905,370

[45] Date of Patent: Mar. 6, 1990

[54] ELECTRONIC PARTS AUTOMATIC MOUNTING APPARATUS

[75] Inventors: Kazuhiro Hineno; Shuuji Nushiyama, both of Gunma, Japan

[73] Assignee: Sanyo Electric Co., Ltd., Osaka, Japan

[21] Appl. No.: 144,060

[22] Filed: Jan. 12, 1988

[30] Foreign Application Priority Data

Jan. 14, 1987 [JP] Japan .................................. 62-6553

[51] Int. Cl.$^4$ .............................................. H05K 3/30
[52] U.S. Cl. ...................................... 29/740; 29/743; 29/759; 294/64.1
[58] Field of Search ................. 29/740, 741, 759, 743; 294/64.1, 2

[56] References Cited

U.S. PATENT DOCUMENTS

| | | | |
|---|---|---|---|
| 4,706,379 | 11/1987 | Seno et al. ............................. | 29/740 |
| 4,727,647 | 3/1988 | Matson et al. ..................... | 29/741 X |
| 4,794,689 | 1/1989 | Seno et al. . | |

OTHER PUBLICATIONS

"Multiple Size Chip Pickup . . ." by Hoebner; IBM Tech. Discl. Bulletin vol. 22, No. 7, pp. 2757–2761; Dec. 1979.

*Primary Examiner*—Carl E. Hall
*Attorney, Agent, or Firm*—Darby & Darby

[57] ABSTRACT

An electronic parts automatic mounting apparatus is disclosed in which a plurality of suction nozzles are provided on the peripheral edge of an intermittently rotating turntable. Electronic parts are delivered to the turntable from a part supply portion, with the parts suctioned and held by the suction nozzles. The electronic parts are then transferred, positioned and mounted on a print substrate placed on an X-Y table. The apparatus is provided with part adjustment means for subjecting the electronic parts suctioned and held by the suction nozzle to various stepwise adjustments at a plurality of working stations provided during the part transfer. The part adjusting means comprise a plurality of positioning working units for positioning electronic parts arranged in correspondence to one part positioning station of the working units, each of the positioning working units being selectively actuated according to the size and shape of the electronic parts. Thus, the positioning of the electronic parts prior to mounting on the print substrate can be carried out with high accuracy, eliminating the necessity for replacing the apparatus according to the size and shape of the tipped parts.

10 Claims, 16 Drawing Sheets

FIG.19
FIG.20
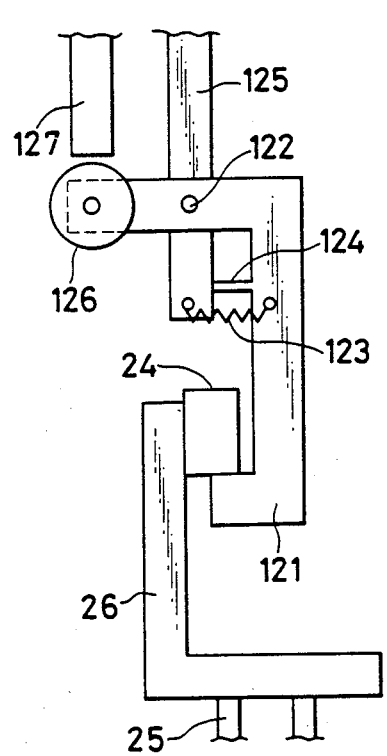
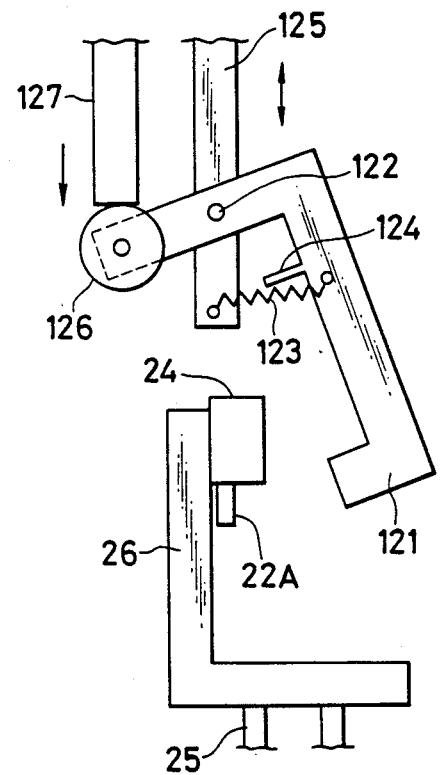

ELECTRONIC PARTS AUTOMATIC MOUNTING APPARATUS

TECHNICAL FIELD

The present invention relates to an automatic mounting apparatus for electronic parts, and more particularly, to an automatic mounting apparatus provided with a part adjusting means for automatically positioning and mounting tipped electronic parts with depending leads or elements similar to depending leads (hereinafter referred to as tipped part(s)), such as resistors, capacitors or transistors, on a print substrate by which the tipped parts may be positioned and adjusted regardless of their size and shape.

BACKGROUND OF THE INVENTION

Various electronic parts mounting apparatus are known. For example, as disclosed in Japanese Utility Model Application Laid-Open No. 57-48672, previously filed by the present applicant, a tipped part seal-in tape is wound and accommodated in a tape reel, the tape being intermittently drawn and delivered to a fixed part-removing station. The tipped parts are suctioned off the tape by a plurality of reciprocally movable suction nozzles which are provided below a lower portion of the peripheral edge of an intermittently rotating turntable. The tipped parts are mounted on a table which is movable and controllable in an X-Y direction for positioning and identifying the tipped parts suctioned and held by the suction nozzles.

Positioning apparatus for tipped parts held by the suction nozzles are described, for example, in Japanese Patent Application Laid-Open No. 56-24,997 and Japanese Utility Model Application Laid-Open No. 58-136,288 Specifications, in which the tipped parts are positioned according to an arranging mode on a print substrate. For purposes of this application, "print substrate" means a printed circuit board. The tipped parts are urged from various directions by positioning pawl members disposed in a fixed positioning station. Japanese Patent Application Laid-Open No. 61-168,298 Specification, discloses an apparatus in which the position and shape of the tipped parts are recognized in advance by optical means. The suction nozzles are then rotated to properly position the tipped parts and simultaneously correct deviations in the positioning of the rotating nozzles at the time of suction.

However, in the conventional positioning apparatus and in the apparatus disclosed in Japanese Patent Application Laid-Open No. 56-24,997 Specification, the positioning and rotation of the nozzles to adjust the direction of the tipped parts cannot be effected at the same time, which limits the speed of the apparatus. An apparatus disclosed in Japanese Utility Model Application Laid-Open No. 58-136,288 shows in FIG. 27 a V-shaped notched groove 201 which is formed at the end of a suction nozzle 200 to suction and hold a cylindrical tipped part. When a center between the V-shaped notched groove 201 at the end of the suction nozzle 200 and each of the positioning pawl members 203 and 204 is deviated from each other, the cylindrical tipped part 202 tends to be positioned by the positioning pawl members 203 and 204 in an unstable state where the tipped part 202 does not properly fit in the V-shaped notched groove 201. In addition, when the tipped part 202 is released from each of the positioning pawl members 203 and 204 after completion of the positioning, the tipped part 202 may become disoriented due to movement in such a way that the tipped part 202 is fitted into the notched groove 201 under the influence of the suction force of the suction nozzle 200. For this reason, it is difficult to adjust the direction of the notched groove 201 at the end of the suction nozzle and the direction of each of the positioning pawl members 203 and 204 for providing precise coincidence, which has to be carried out for each suction nozzle. Moveover, the apparatus must be replaced according to the shape and size of the tipped parts.

In the apparatus disclosed in Japanese Patent Application Laid-Open No. 61-168,298 Specification, when the rotational center between the suction nozzles is deviated, the position of the tipped parts after rotation becomes deviates, and therefore, a troublesome precise adjustment of the rotational center of each of the suction nozzles needs to be carried out.

SUMMARY OF THE INVENTION

The present invention overcome the inconveniences inherent in the above-described conventional electronic parts automatic mounting apparatus. It is a principal object of the present invention to provide an electronic parts mounting apparatus in which a plurality of suction nozzles are provided on the peripheral edge of an intermittently rotating turntable, tip-like electronic parts, delivered from a part supply portion, are suctioned and held by these suction nozzles, the electronic parts being transferred, positioned and mounted on a print substrate, which has been placed on an X-Y table by the intermittent rotation of the turntable. The apparatus is provided with part adjusting means for subjecting the electronic parts suctioned and held by said suction nozzles to various stepwise adjustments at a plurality of working stations. The part adjusting means comprises a plurality of positioning working units for adjusting the position of electronic parts arranged in correspondence to one part positioning station of the working units, each of the positioning working units being selectively actuated according to the size and shape of the electronic part. With this arrangement, the adjustment of the tipped parts prior to mounting them on the print substrate can be carried out precisely, and furthermore, the necessity of replacing apparatus according to the size and shape of the tipped parts can be eliminated.

It is a further object of the invention to provide an arrangement wherein the part adjusting means comprises a working station for detecting the presence or absence of electronic parts on the suction nozzles prior to adjusting the position of the electronic parts, and a working station for detecting the presence or absence and attitude of the electronic parts on the suction nozzles after positioning the electronic parts. With this arrangement, it is possible to positively determine the presence of the electronic parts being transferred by the suction nozzles.

It is another object of the invention to provide an arrangement wherein the part adjusting means comprises a part-rotating working station separately from the positioning working station for the electronic parts. With this arrangement, it is possible to positively position the electronic parts being transferred by the suction nozzles.

It is still another object of the invention to provide an arrangement wherein the suction nozzle is held by means of a holder. The holder is synchronized with the rotation of a turntable so that the holder may be moved upward and downward relative thereto. With this arrangement, it is possible to smoothly carry out the suctioning and holding of the electronic parts by the suction nozzles and mounting them on the print substrate, thus attaining a high assembly speed.

It is another object of the present invention to provide an arrangement wherein means for positioning the suction nozzles is provided to thereby increase the positioning accuracy of the tipped parts prior to mounting them onto the print substrate.

It is a further object of the present invention to provide an arrangement wherein means are provided for rapidly moving the suction nozzles at a station located before a part mounting station. The nozzles are guided by a vertical raid to provide high-speed mounting of the parts onto the print substrate.

BRIEF DESCRIPTION OF THE DRAWINGS

FIGS. 19 and 20 are respectively views schematically showing the operation of upper and lower rails adapted to more the suction nozzles upward and downward;

DETAILED DESCRIPTION OF THE INVENTION

In the following, the specific mode of a part supply device according to the present invention will be described in detail with reference to the embodiments shown in the accompanying drawings.

Figure 1:
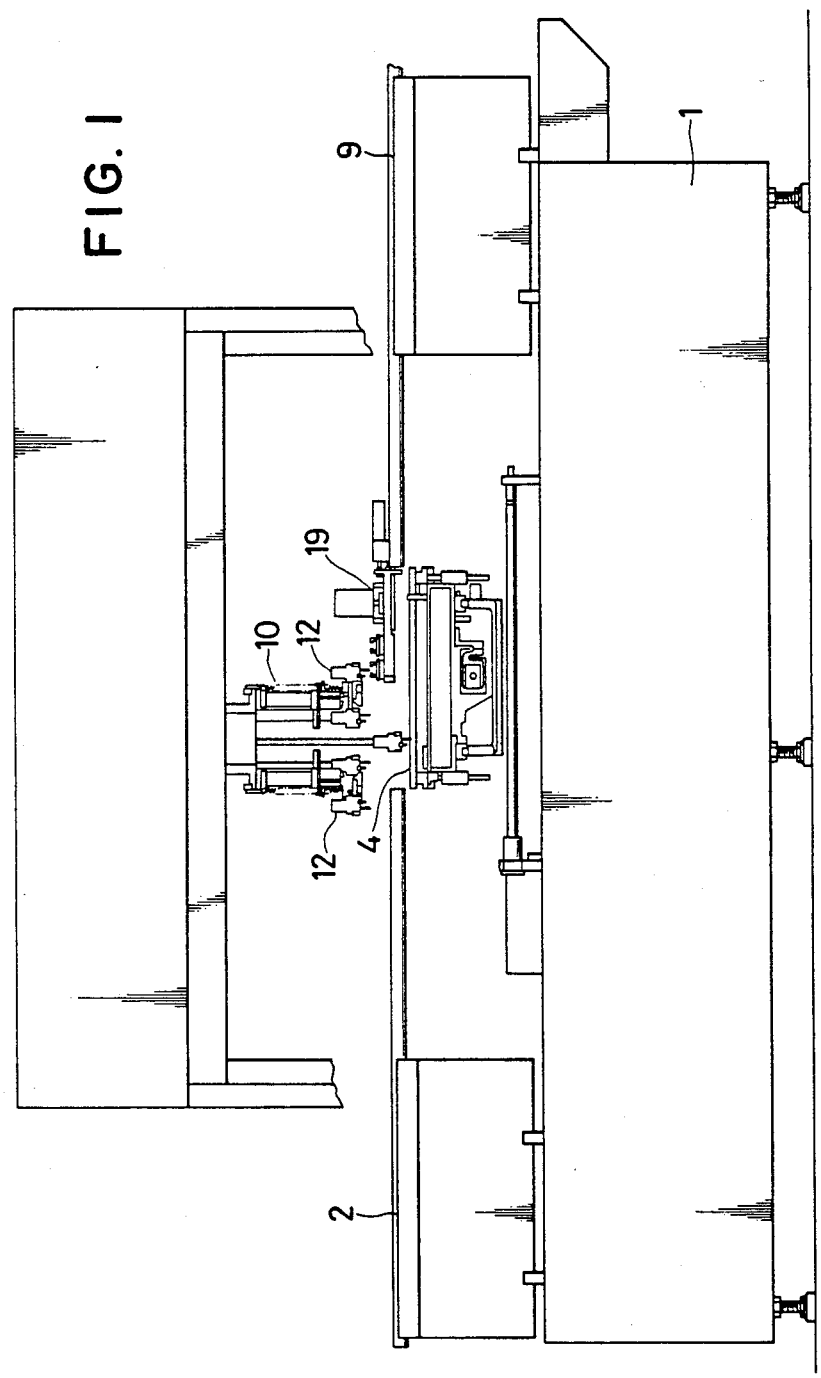
FIG. 1 is a schematic front view showing one embodiment of the entire structure of an electronic parts automatic mounting apparatus according to the present invention.
Figure 2:
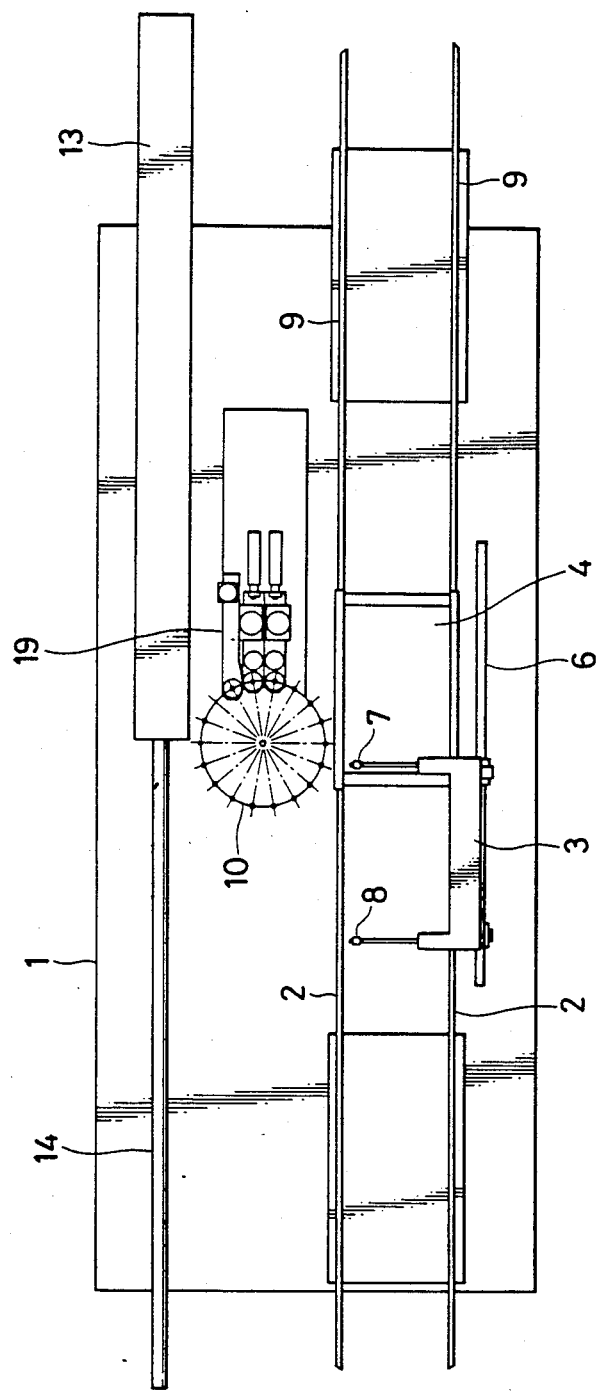
FIG. 2 is a schematic plan view of FIG. 1.
Figure 3:
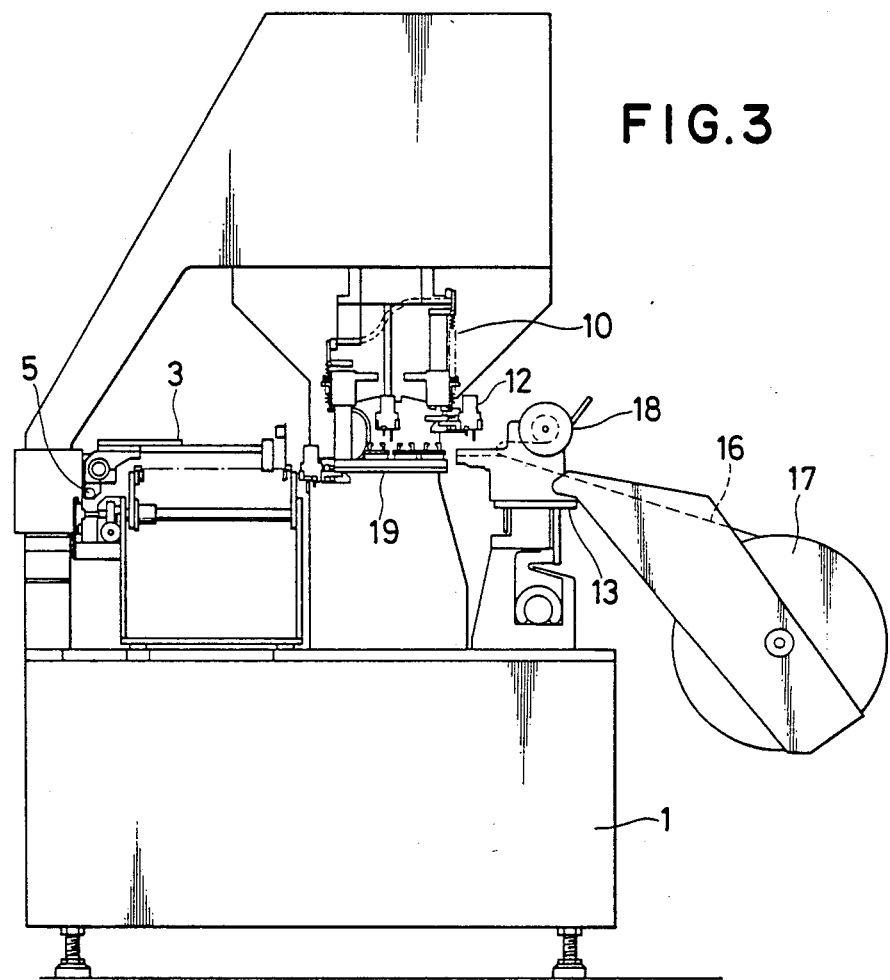
FIG. 3 is a schematic side view of FIG. 1.

As shown in FIGS. 1 to 3 in the drawings, the part supply device has a base bed 1, a supply conveyor 2 for placing a print substrate thereon and a transfer device 3 for transferring the print substrate from the supply conveyor 2 to an X-Y table 4. The device 3 is rotatably supported at one end by means of a support shaft 5 and can be moved along a rail 6. When the print substrate is transported by the supply conveyor 2, a pair of feed pawls 7 and 8 are rotated about the support shaft 5 and moved downward, and the device 3 moves rightward as viewed in FIG. 2. This movement causes the print substrate on the X-Y table 4 to be moved rightward by one pawl 7, whereas at the same time, the other pawl 8 serves to transfer the print substrate on the supply conveyor onto the X-Y table 4.

Figure 21:
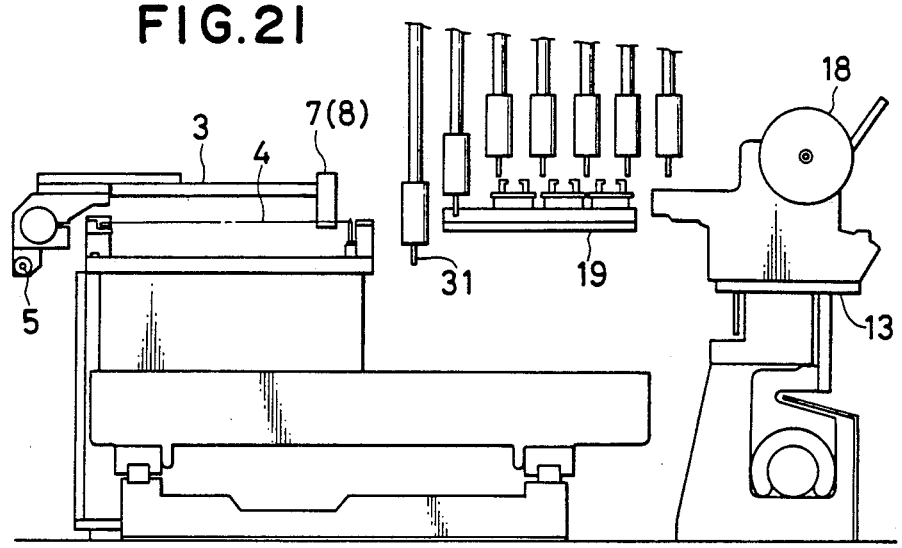
FIGS. 21 to 23 are respectively views showing the vertical movement of the X-Y table.

The X-Y table 4 with the print substrate is move downward (which assumes the state shown in FIG. 22 from FIG. 21) by means of drive means (not shown) whereby the X-Y table 4 may be moved in all directions. A turntable 10, which is mounted on an index unit 11, is rotated by a drive motor (not shown) and is intermittently rotated. Along the peripheral edge of the table 10, eighteen (18) suction heads 12 are provided which are movable upward and downward at equal intervals. A part supply bed 13, capable of being moved along a laterally extending rail 14, has a plurality of juxtaposed tape supply units (supply means) 18 designed so that a tape 16 accommodating therein tip-like electronic parts or tipped parts 15 at equal intervals is wound about a reel 17 and the tape 16 delivers every part at an array pitch. A positioning device 19 is provided for positioning the tipped part 15 prior to mounting on the print substrate. The X-Y table 4 when moved downward can be moved along the X- and Y-axes below the turntable 10 and the positioning device 19 (see FIG. 23).

Figure 4:
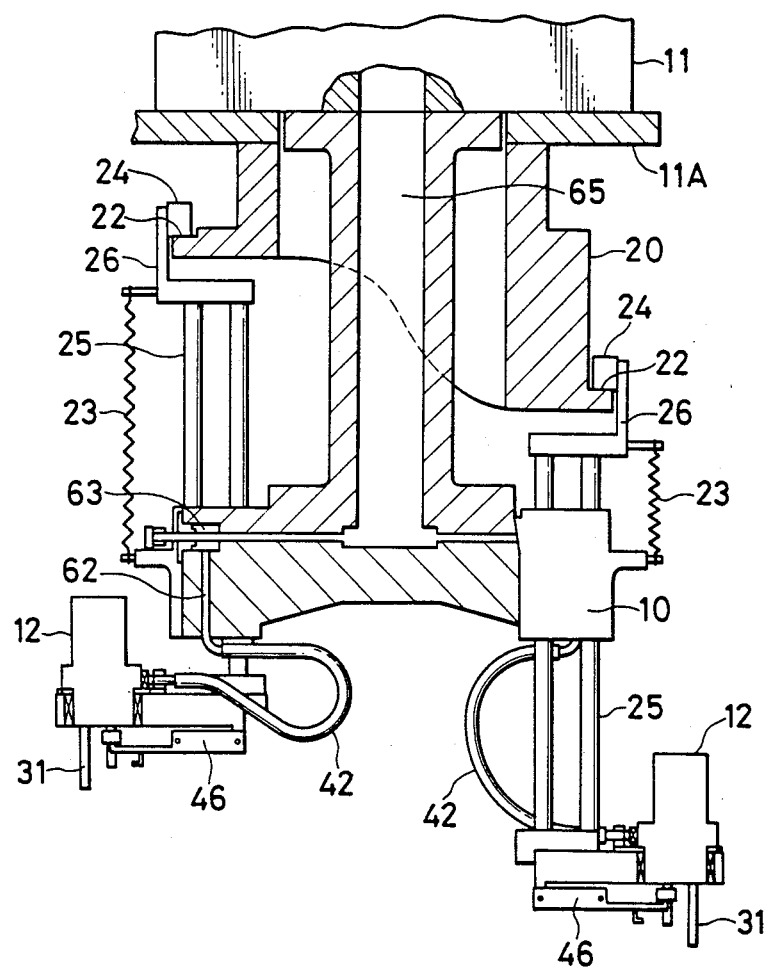
FIG. 4 is a longitudinal sectional view of a turntable.
Figure 5:
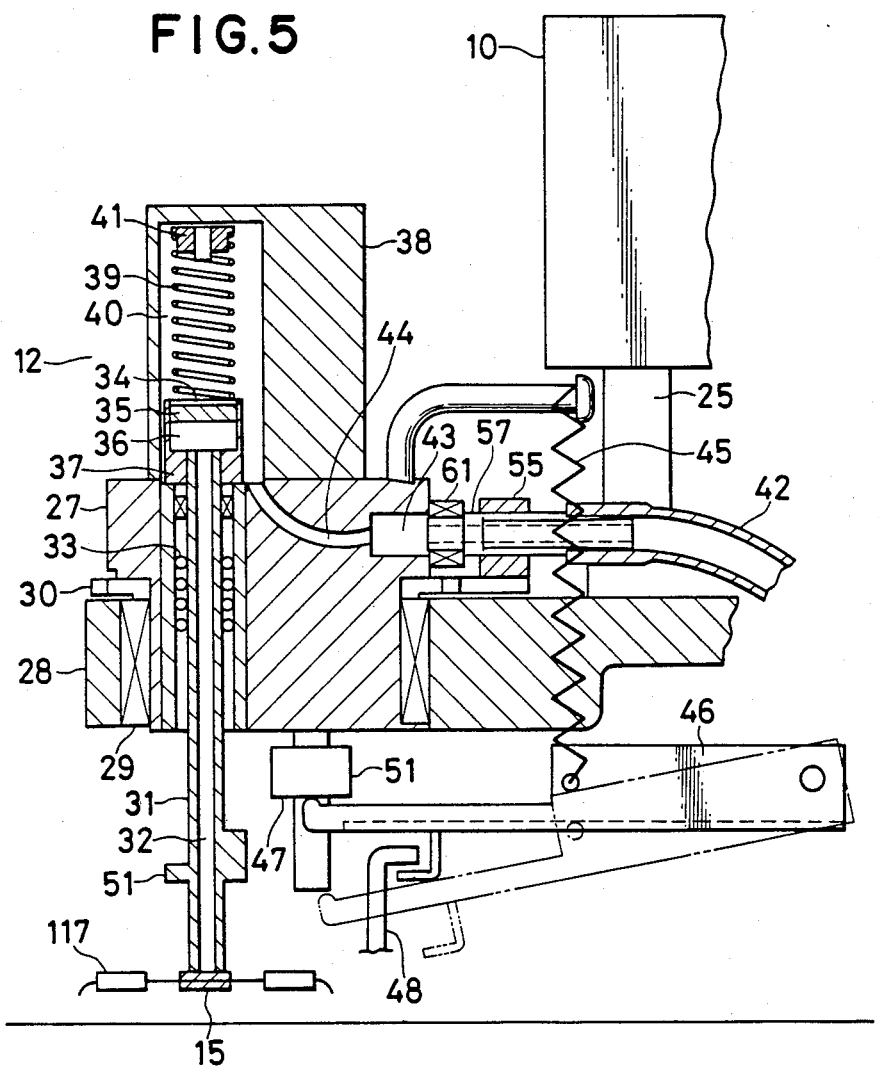
FIG. 5 is a longitudinal sectional view of a suction nozzle.

Next, the turntable 10 and the suction heads 12 will be described in detail in conjunction with FIGS. 4 and 5. A cylindrical cam member 20 guides a hollow cylindrical table suspended and secured to a mounting bed 11A of the index unit 11 so as to surround at the upper portion of a cylindrical portion 21 extending above the turntable 10. The cam member 20 has a cam 22 over substantially the entire periphery thereof. A roller 24 which has a sliding portion provided on the upper end of each of the suction heads 12, is rotated while being urged against the upper surface of the cam 22 by means of a spring 23. Each of the suction heads 12 is moved upward and downward along a profile of the cam 22 and rotated along with the turntable 10. Each of the suction heads 12 has a pair of guide rods 25 which movably extend through the turntable 10. A mounting member 26 with a roller 24 rotatably provided thereon is secured to the upper end of the rods 25. Thus, each of the suction heads 12 is movably supported on the turntable 10.

Next, the suction heads 12 will be described in detail where they rotate along with the table 10 while moving upward and downward with respect to the turntable 10. First, a cylindrical body 27 is rotatably held by a bearing 29 within upper and lower blocks 28. A gear 30 having teeth in the peripheral side integral with the cylindrical body 27 is meshed with a drive mechanism (not shown) for rotation. A suction nozzle 31 interiorly formed with an intake passage 32 in communication with a vacuum pump as a vacuum source (not shown) enables suctioning the tipped part 15 at the lower end thereof. The nozzle 31 is guided by a ball bearing 33 for upward and downward movement and rotation. In the upper end of the nozzle 31 is housed a dust-removing filter 35 that may be installed or removed from an upper opening 34. A filter case 37 having a space 36 is secured to the lower portion of the filter 35. It is noted that the filter case 37 can be formed integral with the suction nozzle 31. A filter accommodating portion 38 is detachably mounted on the upper portion of the cylindrical body 27 to form an accommodation chamber 40 whose interior is in the form of a cavity to receive the filter 35 and a spring 39. Accordingly, when the filter 35 is replaced, the filter accommodation portion 38 may be removed from the cylindrical body 27 and the filter 35 may be installed or removed from the upper opening 34. On the upper end of the accommodation chamber 40, a spring shoe 41 is rotatably provided which is adapted to lock the upper end of the spring 39. The nozzle 31 is downwardly biased by means of the spring 39, which functions as a damper when mounting the tipped parts 15 of different lengths. While the aforesaid filter 35 has been provided above the suction nozzle 31, it is to be noted that the filter is not limited to this location but can be provided anywhere as long as it is integral with the suction nozzle 31. For example, it may be provided at the lower portion within the nozzle.

Figure 25:
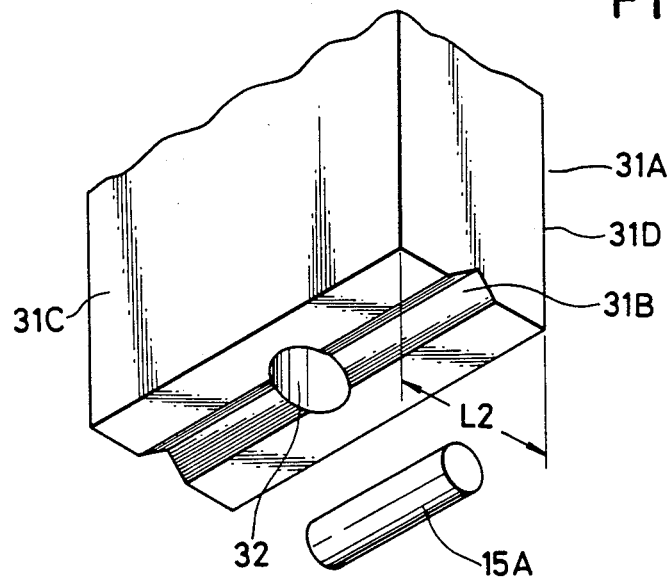
FIG. 25 is a perspective view schematically showing the end portion of the suction nozzle.
Figure 26:
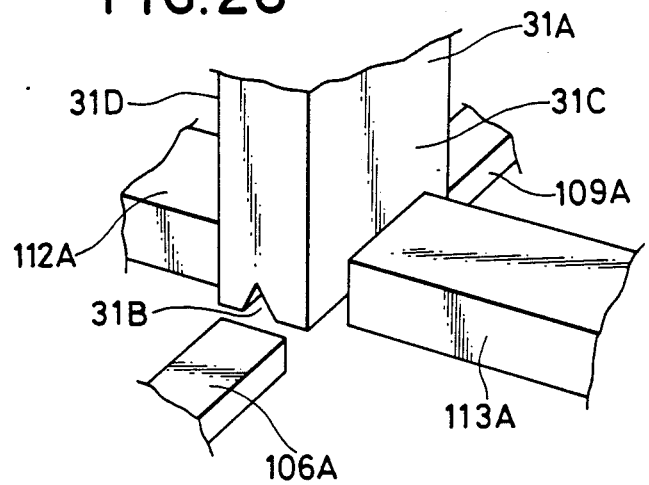
FIG. 26 is a schematic view showing the operation of the positioning pawl member.
Figure 27:
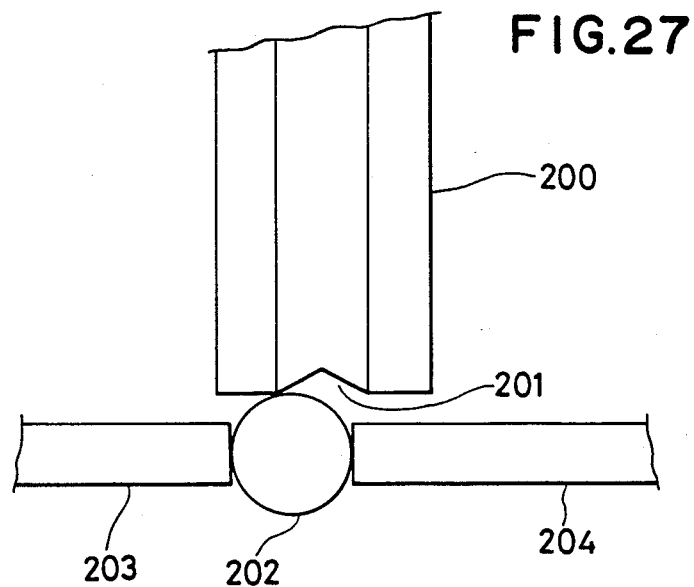
FIG. 27 is a view schematically showing the operation of conventional suction nozzles and positioning pawl members.

The cylindrical body 27 is provided with three suction nozzles 27 at fixed angles, and the filter accommodation portion 38 is formed with three accommodation chambers 40, respectively. One of the suction nozzles, 31A, presents at its lower portion a rectangular parallelepiped as shown in FIGS. 25 and 26 and has, at its bottom surface, a groove 31B provided in the V-shape sectioned lengthwise so that when the cylindrical tipped part 15A is suctioned by the nozzle 31A, the cylindrical peripheral surface comes into contact with two surfaces of the groove 31B along the groove 31B. The tipped part 15A is not wholly received into the groove 31B but the lower portion of the part 15A is bulged out. The suction nozzle 31A is formed with mutually parallel planes 31C and 31D in parallel with the longitudinally extending groove 31B. The dimension L2 between these planes 31C and 31D is slightly longer than the diameter of the part 15A.

In the peripheral side portion of the cylindrical body 27 are formed three communication chambers 43 capable of being communicated with a hose 42 as a connection body in communication with a vacuum pump. The communication chambers 43 are communicated with the accommodation chamber 40 through communication passages 44, respectively. Accordingly, only one suction nozzle 31 can be connected to the hose 42 through the accommodation chamber 40, the communication passage 41 and the communication chamber 43. The other two suction nozzles 31, not participating in the suctioning operation, have a flange surface 47 upwardly raised by means of a keep lever 46 which is upwardly biased by means of a spring 45. An engaging member 48 is adapted to downwardly force the lever 46.

In the following, the rotating device for rotating the suction nozzle 13 is described. A rotating roller 50 is pressed against a projection 51 in the cylindrical side of the suction nozzle 31, and the rotating roller 50 is rotated by a drive motor 52 through a belt 53, whereby the nozzle 31 may be rotated by a fixed angle.

Figure 7:
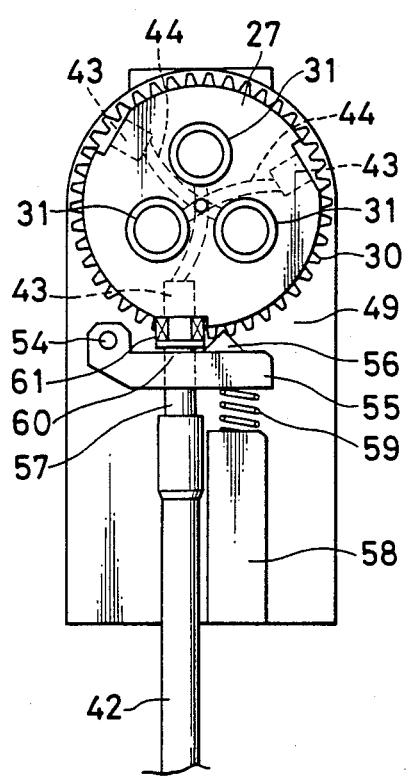
FIGS. 7 and 8 are respectively plan views showing a rotational mechanism for the suction nozzles.

Next, a connection switching device 49 is described in detail with reference to FIGS. 7 and 8. A pivotable lever 55 which pivots about a pivot pin 54, has a pawl 56, which engages between the teeth of the gear 30 provided on the cylindrical body 27. This impedes the rotation of the cylindrical body 27, integral with a joint 57 connected to the hose 42. An engaging body 58 and a spring 59 are provided between the engaging body 58 and the lever 55 so that the spring 59 is always biased to cause the pawl 56 to engage the gear 30. The end of the joint 57 has a reduced diameter portion, and an offset portion on which is provided a stopper 60. A seal packing 61, being a ring-like or cylindrical seal member, is wound about the reduced diameter portion so that the end may abut with the stopper 60. Accordingly, when the pawl 56 is engaged with the gear 30 by the spring 59, the joint 57 and the communication chamber 43 are communicated with each other to prevent a vacuum leak by the packing 61.

Figure 8:
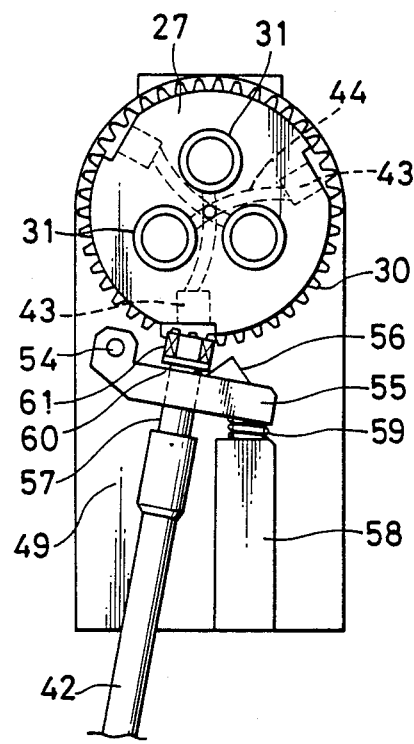

In the case where the joint 57 is brought into communication with the other communication chamber 43, the lever 55 is rotated by a drive mechanism (not shown) so that the joint 57 and the pawl 56 are moved away from the cylindrical body 27 and the gear 30, respectively, and the cylindrical body 27 may be rotated (see FIG. 8). It is of course to be noted that an open end of the communication chamber 43 is circular and that the open peripheral edge has a planar shape.

The other end of the hose 42 is connected to a connection hose 62 which extends through the turntable 10, the connection hose 62 being communicated with a vacuum pump (not shown) through a switching valve 63, a laterally extending intake passage 64 and a central intake passage 65 of the cylindrical body 27.

Figure 9:
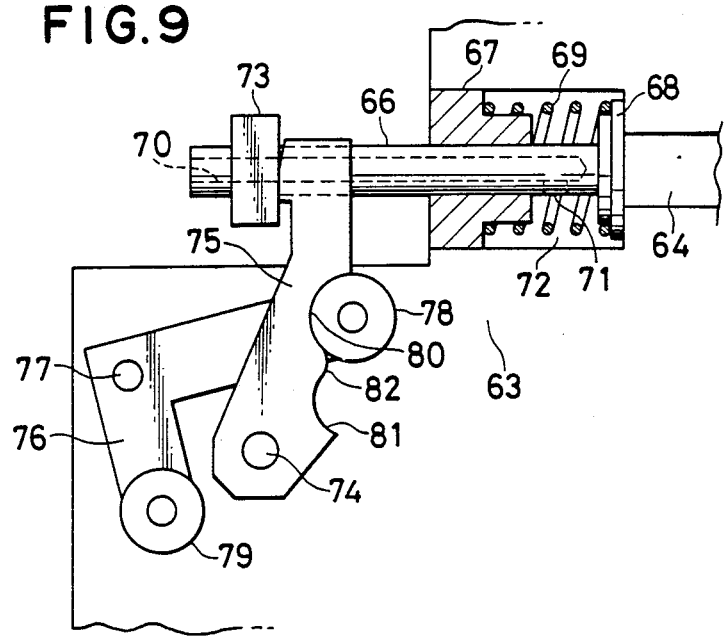
FIGS. 9 and 10 are respectively plan views showing, in section, a switching valve of the suction nozzles.
Figure 10:
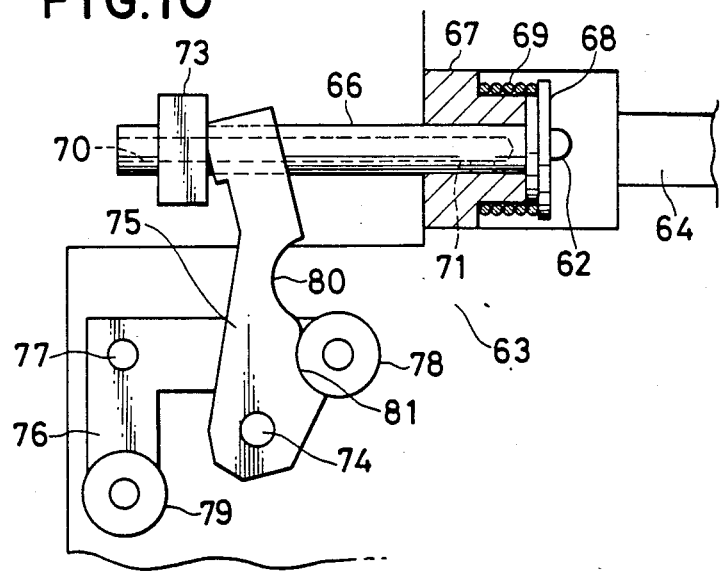

The switching valve 63 is described with reference to FIGS. 9 and 10. A valve stem 66 is slidably mounted on a bearing body 67, and a valve body 68 is mounted on the end of the valve stem 66. In FIG. 9, a spring 69 causes the valve body 68 to close an end opening of the laterally extending intake passage 64 of the turntable 10 to shut off the vacuum circuit formed by the vacuum pump. The valve stem 66 is bored with an atmosphere communication passage 70 through which the valve body does not extend, and the side of the communication passage 70 closer to the valve body 68 is bored with a lateral hole 71 so that a valve chamber 72 can communicate with the atmosphere. When the valve body 68 closes the intake passage 64, the valve chamber 72 is connected with the atmosphere through the lateral hole 71 and the communication passage 70, such that when the valve body 68 opens the intake passage 64, the lateral hole 71 is closed by the bearing body 67 to form a vacuum circuit. A collar 73 is mounted on the other end of the valve stem 66. A first lever 75, one end of which is pivotally supported by a pin 74, has the other end of the valve stem 66 in contact with the collar 73. An approximately-shaped second lever 76 is pivotably supported at its intermediate portion by a pin 77, with rotatable rollers 78 and 79 provided on opposite ends thereof. With this, when the second lever is swung by a drive source (not shown), one roller 78 engages a first recess 80 and a second recess 81 of the first lever 75 beyond a projection 82.

It will be noted that high pressure air is blown through the end on the atmosphere side of the valve stem 66 whereby the vacuum circuit to each of the suction nozzles 31 may be forcibly shut off or the aforesaid vacuum circuit may be cleaned.

Figure 11:
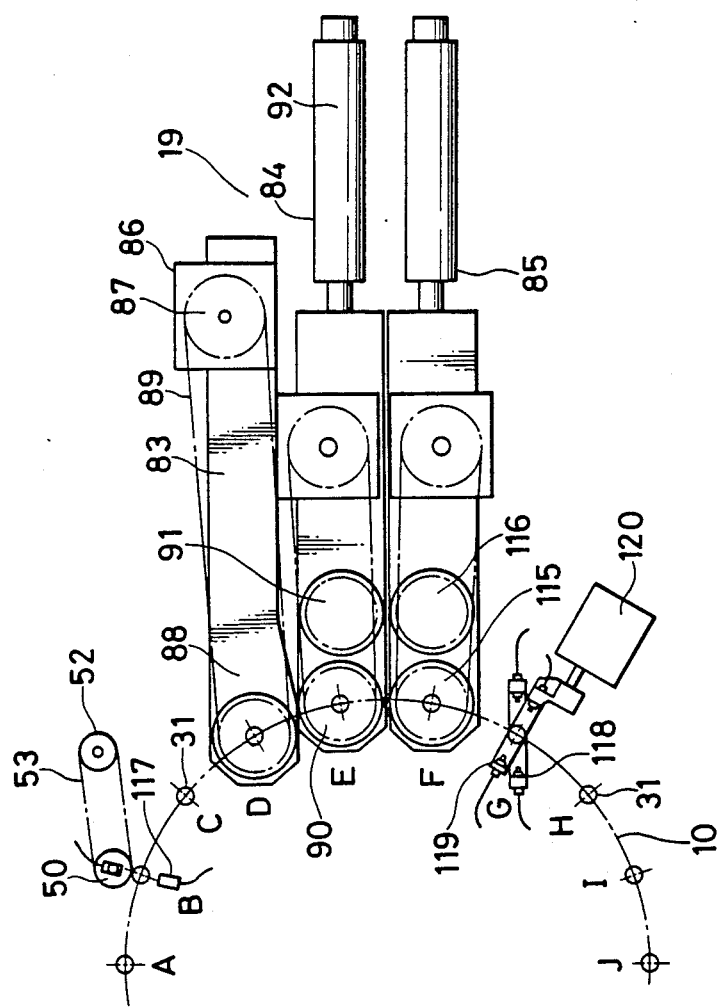
FIGS. 11 is a schematic plan view of a positioning device arranged in a positioning working station.

As shown in FIG. 11, the turntable 10 turns around working stations A to R, and the positioning stations D, E and F are provided with positioning devices 83, 84 and 85, respectively. The positioning device 83 is of conventional construction and will be briefly explained. A belt 89 is extended between an output shaft pulley 87 of a drive motor 86 and a positioning unit 88, and a positioning pawl (not shown) may be rotated.

Figure 12:
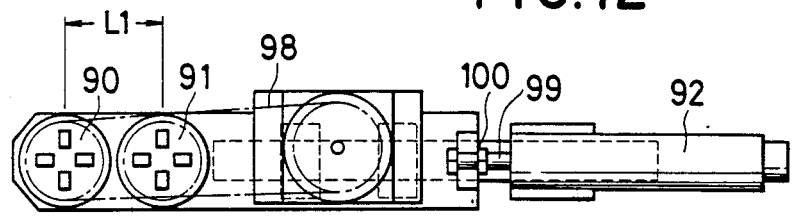
FIG. 12 is a schematic plan view of a positioning working unit.
Figure 13:
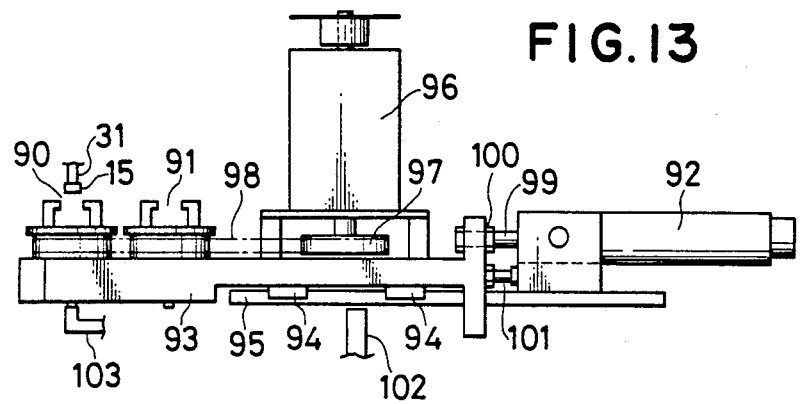
FIG. 13 is a schematic side view of the positioning working unit.

Referring to FIGS. 12 and 13, the positioning devices 84 and 85 in the positioning stations E and F, will be described taking the device 84 as an example. The positioning device 84 has two positioning units 90 or 91, and either unit 90 or 91 may be moved to the position immediately under the suction nozzle 31 in the station E by a drive cylinder 92 in accordance with a controller program determined in advance according to the sizes of the tipped parts 15. The units 90 and 91 are provided movably with respect to a frame 93, and the frame 93 is linearly moved by contacting two pairs of guides 94 with a guide rail 95.

The units 90 and 91 are spaced apart by an amount L1 left in the foremost end of the frame 93. A belt 98 is extended through the units 90, 91 and an output shaft pulley 97 of a drive motor so that as the pulley 97 rotates, the units 90 and 91 are rotated in synchronism therewith. A line connecting centers of the units 90 and 91 is parallel with a moving direction of the frame 93 which moves along the guide rail 95. The amount of movement of the frame 93, which is connected through a connection member 100 to a rod 99 of the drive cylinder 92, is defined by a backward-movement limiting stopper 101, secured to a fixed portion of the cylinder 92, and, a forward-movement limiting stopper 102 such that the amount of movement is the same as spacing L1. Therefore, if the center of the suction nozzle 31 is registered with the center of the positioning unit 90, when the drive cylinder 92 is actuated, the center of the unit 91 registers with the center of the suction nozzle 31.

Figure 14:
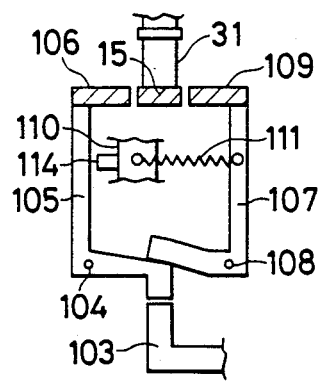
FIG. 14 is a schematic longitudinal sectional view of the principal part of the positioning working unit.

In the following, the construction of the positioning units 90 and 91 will be described with reference to FIG. 14. When a pusher 103 is moved upward by means of a cam (not shown), a first opening and closing plate 105 is rotated about a pin 104 in a direction of opening a positioning pawl 106. A second opening and closing plate 107 is also rotated about a pin 108 in response to the rotation of the first opening and closing plate 105 to open the pawl 109. When a pusher 103 is move downward, both the pawls 106 and 109 are closed by a spring 111, with one end thereof supported on a fixed portion 110 to hold the tipped part 15 suctioned by the suction nozzle 31 to thus position the part 15. Four positioning pawls are provided per unit with the opening and closing of the other pair of pawls 112 and 113 operating similarly to the pawls 106 and 109. A stopper 114 is used to limit the closing direction of the opening and closing plate 105.

The positioning pawls 106, 109, 112 and 113 are rotated, during the rotation of the turntable 10, by the drive motor 96. The pawls are rotated in the direction in which the suctioned tipped part 15 is rotated, that is, in a direction adjusted to the proper direction for mounting the part on the print substrate. Then when the suction nozzle 31 is moved downward, only the centering operation is carried out.

Figure 15:
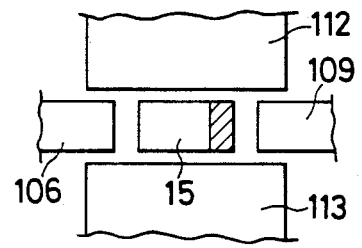
FIGS. 15 and 16 are respectively sectional views showing the tipped parts positioned by positioning pawl members.
Figure 16:
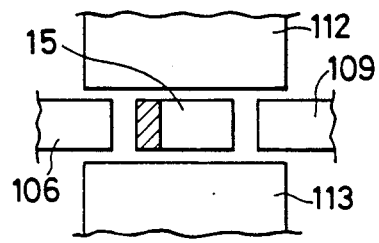

As shown in FIGS. 15 and 16, most of the tipped parts 15 have a symmetrical shape, and therefore, where the tipped parts 15 are rotated through 180° and mounted on the print substrate, if the suction nozzle 31 is rotated as previously mentioned so that the tipped parts 15 are rotated in advance through 180°, the pawls 106, 109, 112 and 113 need not be rotated during the rotation of the turntable 10.

The construction of the positioning unit 90 is substantially similar to that of the unit 91 but positioning pawls 112A and 113A have a thickness greater than that of the pawls 112 and 113. Accordingly, the pawls 112A and 113A will not position the cylindrical-shaped tipped part 15A, instead positioning the suction nozzle 31A such that the direction of the center axis of the part 15A is positioned. In positioning the suction nozzle 31A, a dimension L2 between planes 31C and 31D of the nozzle 31A is made longer than the diameter of the part 15A. Therefore, the part 15A is not disengaged from a groove 31B and the tipped parts 15A are not displaced by both the pawls 112A and 113A. Also, the construction for opening and closing the other pair of positioning pawls 106A and 109A is similar to that of the aforementioned positioning unit 91 but the positioning pawls 112A and 113A position the suction nozzle 31A while the axial direction of the cylindercial tipped part 15A is directly positioned. Accordingly, the horizontal width of both the pawls 106A and 109A are shorter than the dimension L2 between the planes 31C and 31D of the suction nozzle 31A and slightly longer than the tipped part 15A. A portion bulged out of the groove 31B is held to position the axial direction of the tipped part 15A.

As described above, when the tipped parts 15 pass through the positioning stations D, E and F, the parts are positioned by any of the positioning units 88, 90, 91, 115 and 116 in any of the stations. However, which unit is used is selected according to the program of the controller depending on the sizes and shapes of the tipped parts 15. In the stations other than the thus selected station, the suction nozzle 13 will not be moved downward by a mechanism (not shown) and the non-selected positioning unit is not operated.

Figure 17:
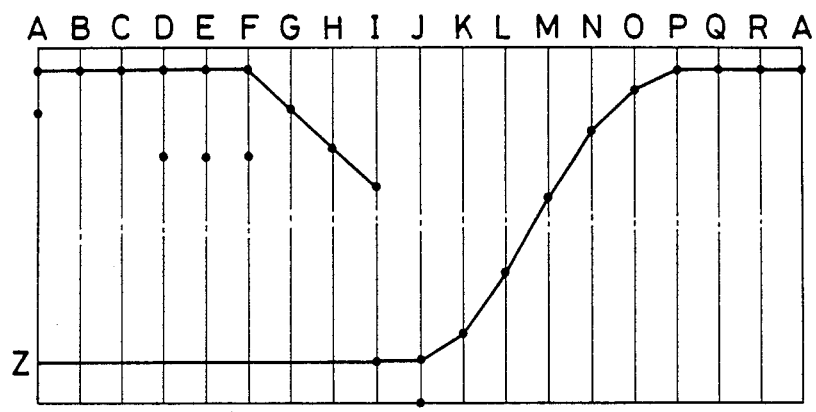
FIG. 17 is a view showing the displacement of upper and lower levels of the suction nozzles.

FIG. 17 shows the displacement of the upper and lower levels of the suction nozzle 31. In the working stations A, D, E, F and J., the nozzle 31 is moved away from the cam 22 to effect upper and lower operations. This can be achieved by provision of upper and lower rails (not shown), which are either associated with the cam 22 or moved down, at the portion in which the cam is interrupted.

In the working stations A, B, C, D, E, F and G, the positioning units 88, 90, 91, 115 and 116 use photosensors 117 and 118 as the presence or absence detection means for detecting the presence or absence of the parts 15. A photosensor 119 is used as detection means capable of being swung by a drive motor 120 for detecting the suction nozzle attitude. Since all the photosensors are located below the suction nozzles 31, the parts 15 have to be moved at a high level, particularly in station J where the suction nozzle 31 has to move down to the print substrate for mounting the tipped parts 15.

Figure 18:
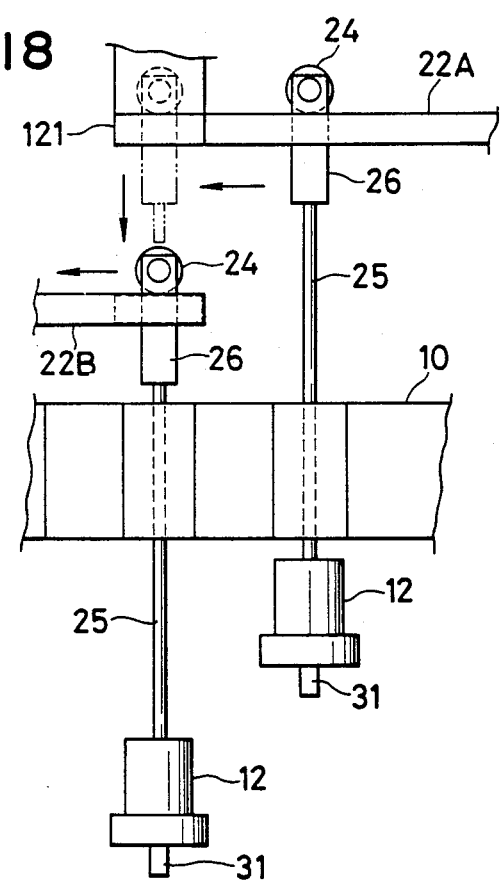
FIG. 18 is a side view schematically showing the vertical movement of the suction nozzles in the working station after the parts have been positioned.

Thus, in the station I, the nozzles are moved down to a level Z, from which the next station J operates. The construction will be described in detail with respect to FIGS. 18, 19 and 20. FIG. 18 shows the state of the working stations H and I from the right-hand. The roller 24 is at the upper end of the suction head 31, which has travelled on the cam 22 from the station H by rotation of the turntable 10. The roller 24 is thus moved onto the upper and lower rails 121 and carried to the next station I. The construction of the rail 121 will be described in detail with reference to FIGS. 19 and 20. The rail 121 is pivotable about a pin 122. In FIG. 19, a stopper 124 is biased by a spring 123, the stopper being projectingly provided on the rail 121, into contact with a shaft 125. The shaft 125 is moved upward and downward by a cam drive mechanism (not shown) to move the rail 121 upward and downward through the pin 122. A rotatably roller 126 is mounted on the end of the rail 121. The roller 24 is moved away from the rail 212 by pushing down the roller 126 with a push-down member 127. The cam 22 of the cylindrical cam member 20 has a part in which the rail 121 is interrupted, with one side being greatly different in upper and lower positional relation from another side thereof, such that the rail 121 is disposed at the interrupted portion for vertical movement. In FIG. 20, the cam 22A on one side is positioned upwardly and at the same level as the rail 121. Thereafter, the roller 24 is moved onto the rail 121 and then the rail 121 moves down together with the shaft 125. As a consequence, the rail 121 assumes the same level as that of the lower cam 22B (see FIG. 18). When the roller 24 is then moved onto the lower cam 22B, it arrives at station J. At this time, when the roller 126 is pushed down by the push-down member 127, the rail 121 is rotated as shown in FIG. 20, after which the rail 121 is moved upward to assume the same level as the upper cam 22A, with the push-down member 127 also moving above the roller 126. While in the present embodiment, an example has been shown in which the rail 121 is used for a downward transfer, it is to be noted that the rail 121 is not limited thereto, but can be used for an upward transfer where there is a difference in the upper and lower positional relation.

While in the present invention, the tipped parts 15 are urged by the pawls 106, 109, 112 and 113 from all directions to perform the positioning in the direction of axis X and in the direction of axis Y, and the positioning in the direction of O by the drive motor 96 through the belt 98, it is to be noted that the arrangement is not limited thereto. For example, the position of the tipped parts 15 can be optically detected to cause the suction nozzle 31 to rotate and thereby position the parts X and Y and $\theta$ directions at the X-Y table 4.

In such an arrangement, the print substrate is first placed on the supply conveyor 2 and transported to arrive at the lower position of the transfer device 3, where the conveyor 2 stops. The pair of the feed pawls 7 and 8 are rotated about the support shaft 5 and moved down, and the right pawl 7 comes into engagement with the left end of the print substrate on the X-Y table 4 whereas the left pawl 8 comes into engagement with the left end of the print substrate transported by the conveyor 2. Thereafter the transfer device 3 moves along the rail 6 to transfer the substrate from the supply conveyor 2 to the X-Y table 4 and transfer the substrate on the table 4 onto the discharge conveyor 9, thus moving it rightward from the conveyor 9.

Figure 22:
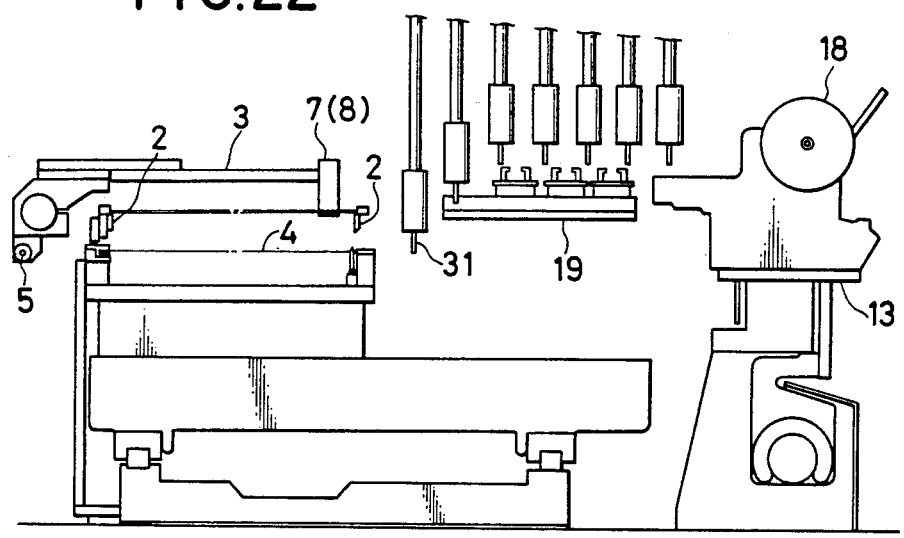
Figure 23:
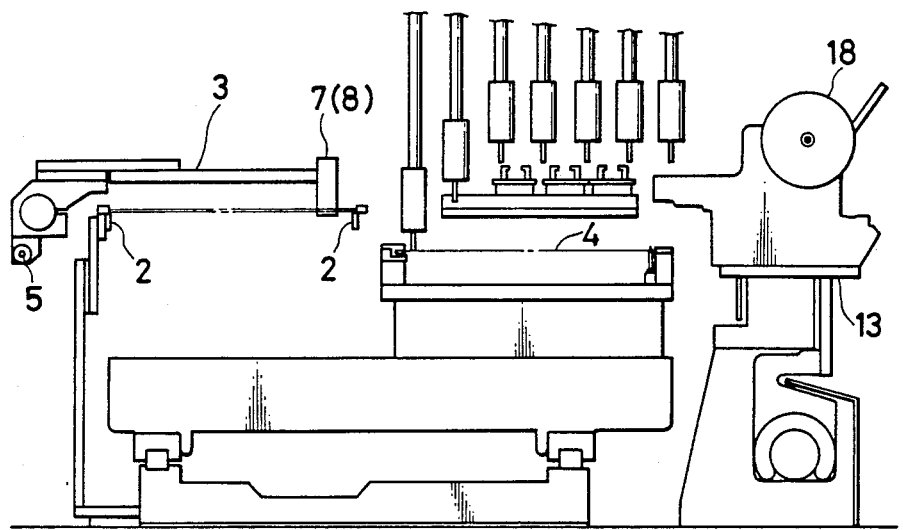

Then, the print substrate is positioned by the positioning device (not shown) on the X-Y table 4 but the transfer device 3 causes the feed pawls 7 and 8 to be moved upward, returning to its original position along the rail 6. The X-Y table 4 is moved down as shown in FIG. 22 by the drive means (not shown) and becomes movable in the longitudinal direction (Y axis) and in the lateral direction (X axis) (see FIG. 23) whereby the X-Y table 4 moves to the lower position of the turntable 10 and the positioning device 19. Where the supply bed 13 has already been moved along the rail 14 so that the bed 13 is juxtaposed on the part supply bed 13, to a suitable tape supply unit 18, in opposition to the turntable 10, the upper film of the tape 16, which is wound about the reel 17 is peeled off by a peeling mechanism (not shown) and the tipped part is in a position directly under the suction nozzle 31.

Now, the index unit is rotated by the motor and the turntable 10 is intermittently rotated.

First, in the suction station A or the first working station, the tipped part 15 is suctioned and chucked by the lower end of the suction nozzle 31 from the tape supply unit 18. In a station A, the lower end of the suction nozzle 31 of the suction nozzle 12 must be lowered to a level of the tape 16. This may be accomplished in such a way that the roller 24 on the upper end of the head is placed on the vertically movable rail (not shown) disposed in the interrupted portion of the cam 22 of the cam member 20. This suctioning is carried out in such a way that the joint 57 is in communication with the communication chamber 43, the hose 42, the connection hose 62, the valve chamber 72, the laterally extending intake passage 64, the central intake passage 65 of the cylindrical portion 21 and the vacuum pump (not shown) which are all connected through the suction nozzle 31 of the suction head 12, the filter 35, the accomodation chamber 40 of the cylindrical body 27, the communication passage 44, the communication chamber 43 and the seal packing 61 to form the vacuum circuit.

Figure 6:
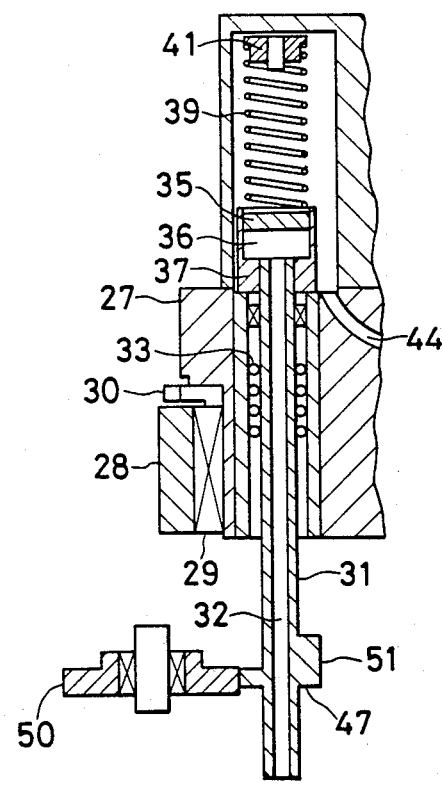
FIG. 6 is a longitudinal sectional view of a principal part showing the rotating state of the suction nozzle.

The suction head 12 is moved to the second working station B through the roller 24 slidably moving on the cam 22 of the cam member 20. In this Station B, whether the suction nozzle 31 suctions the tipped part 15 is directed by the photosensor 117, and the suction nozzle 31 is rotated by the rotating device while suctioning the tipped part in the direction programmed in advance in the controller (not shown). More specifically, as shown in FIG. 6, the rotating roller 50 is pressed against the projection 51 of the suction nozzle from the outside, and the drive motor 52 is rotated to rotate the roller 50 by a fixed angle through the belt 53. After this rotation, the rotating roller 50 is moved away from the suction nozzle 31. In this manner, the tipped part 15 is rotated in advance prior to positioning so as to provide the proper direction when the tipped part 15 is mounted.

Next, in the working station C, in the case where the photosensor 117 has ditected that in the second working station B, the suction nozzle 31 does not suction the tipped part 15, the vacuum circuit to the suction head 12 is shut off by the switching valve 63. This is, when the roller 70 is urged by the drive source (not shown) so that the mode is change from the FIG. 11 state to the FIG. 9 state, the second lever 76 swings, and the roller 78 having engaged the second recess 81 of the first lever 75 moves beyond the projection 82 into engagement with the first recess 80. Accordingly, the first lever 75 is also rotated clockwise, and the valve stem 66 is moved by the spring 69 so that the valve body 68 closes the laterally extending intake passage 64. Thus, the suction nozzle 31 comes into communication with the atmosphere through the hose 42, the connection hose 62, the valve chamber 72, the lateral hole 71 of the valve stem 86 and the atmosphere connection passage 70.

In the working stations D, E and F, of the positioning station of the tipped parts 15, there is indicated any of the positioning stations D, E, and F, in accordance with the fixed program depending on the shapes of the parts 15, these stations position any of the positioning units 88, 90, 91, 115 and 116, and others according to whether the tipped parts are suctioned in the suction station A. For example, if the right-hand positioning unit 91 is seleted in the positioning station E, the frame 93 is moved through the spacing L1 along the guide rail 95 through the rod 99 by the drive cylinder 92. The position is decided by the forward-movement limiting stopper 102, and the unit 91 has already been moved before the suction nozzle 31 arrives at the position directly below the nozzle 31. At that time, the stations D and F are idle stations.

The positioning operation for the tipped parts 15 will be described hereinafter. First, when the cam (not shown) is moved upward by the pusher 103, the first and second opening and closing plates 105 and 107 are rotated about the pins 104 and 108, respectively, against the spring 111, and the positioning pawls 106, 109, 112 and 113 open. The suction nozzle 31 is moved down by downward movement of the rail (not shown) on which the roller 24 on the upper end of the suction head 12 rests. When the pusher 103 is moved down, the parts are held by the pawls 106, 109, 112 and 113 and positioned from all directions. After the pusher 103 has been again moved upward, the rail moves upward and the suction nozzle 31 also moves upward. Thereafter, the turntable is intermittently rotated through one division.

Subsequently, in the detection station G, whether the suction nozzle 31 has actually suctioned the tipped part 15 or whether the suction nozzle 31 has a suctioned tipped part 15 in a normal position are detected by the photosensors 118 and 119. The sensor 119 can be swung by the drive motor 120 to check the suction attitude of the tipped part 15. However, a single sensor can be used to detect the presence or absence and the attitude of a part.

In the ninth working station I, the suction nozzle 31 is rapidly moved down to the level Z, which will be described with reference to FIGS. 18, 19 and 20. First, in the state shown in FIG. 19, the upper cam 22A is the same level as the rail 121. The roller 24 is moved onto the rail 121 and then the rail 121 together with the shaft 125 are moved down to assume the same level as the lower cam 22B. When the roller 24 is moved onto the lower cam 22B, the roller 126 is pushed down by the push-down member 127. Then, as shown in FIG. 20, the rail 121 is rotated against the spring 123, and thereafter the rail 121 is moved upward together with the shaft 125 to assume the same level as the cam 22A, and the push-down member 127 is also moved so as to be moved upwardly on the roller 126.

In the packaging station J or the tenth working station, the tipped part 15 is mounted on the print substrate on the X-Y table 4. For this reason, the suction nozzle 31 is moved down to the substrate by the rail (not shown) for carrying out the mounting.

More specifically, only in the case where the presence of the tipped part 15 is detected by the aforementioned photosensor 117, is such presence likewise detected by the photosensor 118 in the detection station G, and the judgement is made by the photosensor 119 whether the suction attitude is normal. The switching valve 63 is then actuated as described above whereby the intake passage 64 is closed by the valve body 68, the valve chamber 72 is brought into communication with the atmosphere through the atmosphere communication passage 70 of the valve stem 66 and the high pressure air is blown through the end on the atmosphere side of the valve stem 66 to thereby perform mounting of the part as previously described. Accordingly, in the case where the presence of the tipped part 15 is not detected by the photosensors 117 and 118 or the judgement is made by the sensor 119 to the effect that the suction attitude is not normal, the suction nozzle 31 will not be moved down to effect mounting.

The succeeding stations K, L and M are idle stations. In the discharge station N, even if the presence of the tipped part 15 is detected by the photosensors 117 and 118, but at an abnormal suction attitude as judged by the photosensors 117 and 118, the tipped part 15 is discharged from the lower end of the suction nozzle 31. That is, as described above, the vacuum circuit is shut off and high pressure air is blown through the end of the valve stem 66.

During suction, dust or the like is drawn through the end of the suction nozzle 31 and trapped by the filter 35. The duct stays within the space 36 of the filter case 37, until the high pressure air is blown through in the aforementioned packaging station J and the discharge station N. The air discharges the dust from the lower end of the nozzle 31 to automatically clean the filter 35 and its peripheral portion. Accordingly, when the vacuum circuit is formed, dust or the like will not block the vacuum circuit.

In the next station O, which of the three suction nozzles 31 of the suction head 12 used is detected by the sensor (not shown).

In the next nozzle selection station P, the next suction nozzle 31, used is determined on the basis of the data programmed by the controller. When the tipped parts 15 are of the same shapes and sizes, the same suction nozzle 31 can be used and the selection need not be carried out but the nozzles can be sequentially replaced. Where both small and large tipped parts are used, selection can be made so that suction nozzles corresponding to each size may be used.

This selection operation or the operation of the connection switching device 49 will be described. To communicate the joint 5 with the other communication chamber 43, the lever 55 is rotated by the drive mechanism (not shown). Thus, the joint 57 and the pawl 56 are moved away from the cylindrical body 27 and the gear 30, respectively. A gear (not shown) is meshed with the gear 30, and the cylindrical body 27 is rotated by the gear in the drive mechanism (not shown) through the bearing 29. This rotation is carried out in a way such that the keep lever 46 is downwardly rotated by the engaging member 48 to move downward all the suction nozzles 31. The lever 55 is rotated so that the joint 57 is in communication with the communication chamber 43 corresponding to the selected suction nozzle 31 to bring the pawl 56 into engagement with the gear 30, thus providing a complete seal by the seal packing 61. The keep lever 46 is returned by the spring 45 so that the keep lever 46 comes into contact with the flange surface 47 of the suction nozzle 31, and the suction nozzle 31 moves upward. The next station Q is an idle station.

In the last working station R, in the case where the suction nozzle 31A is selected in the aforementioned station P, the nozzle 31A is rotated by the rotating roller 50 of the rotating device in the direction in which the tipped parts 15A may be easily suctioned from the tape supply unit 18 in the first working station A. This is, the nozzle 31A is rotated so that the axial direction of the cylindrical tipped parts 15A supplied from the tape supply unit 18 is coincident with the direction of the groove 31B of the suction nozzle 31A. Where in the aforementioned station P, the suction nozzle 31A is not selected, and the suction nozzle 31 is used, such an operation is not carried out.

In the first working station A, the suction nozzle 31A suctions the cylindrical tipped part 15A from the tape supply unit 18 which accommodates therein the parts 15A.

In the next station B, as described previously, the suction nozzle 31A is rotated by the rotating device while suctioning the tipped part 15A in the direction programmed in advance in the controller (not shown). This is, the suction nozzle is rotated in advance prior to positioning so that the tipped part 15A assumes the direction used when mounting.

Since which working station is used and which positioning unit is used have already been determined when the tipped parts 15A are suctioned in the suctioning station A, the unit has already been moved before the suction nozzle 31A arrives. Accordingly, in the cas of these cylindrical tipped parts 15A, the positioning unit 90 has already been moved by the drive cylinder, in the positioning station E, to a position directly below the suction nozzle 31A.

Figure 24:
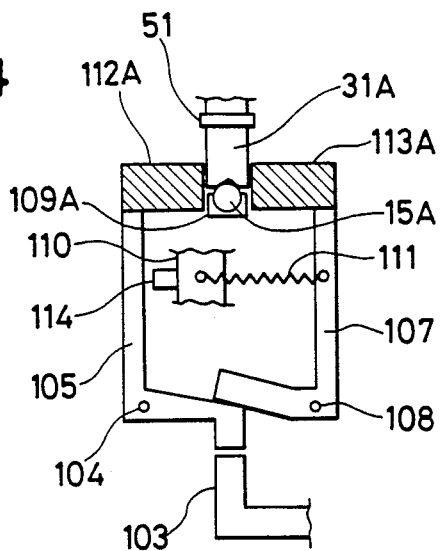
FIG. 24 is a schematic sectional view of the positioning working unit.

The positioning operation for the tipped parts 15A will be described. First, the positioning pawls 106A, 109A, 112A and 113A are opened by the pusher 103 (the other not shown), the suction nozzle 31A moves down and the pusher 103 moves down to close the pawls 106A, 109A, 112A and 113A. With this, the planes 31C and 31D of the nozzle 31A are held by the pawls 112A and 113A to thereby determine the direction of an axis of the part 15A (see FIG. 24). At the same time, the axial direction of the part 15A is directly positioned by the pawls 106A and 109A. Even if the tipped part 15A deviates at the time of the aforesaid suction, and does not enter the groove 31B for transport to the positioning station E, the tipped part 15A can still be urged by the pawls 112A and 113A, and therefore the part 15A is forced to enter the groove 13B.

What is claimed is:

1. An electronic parts automatic mounting apparatus having a plurality of suction nozzles provided on the peripheral edge of an intermittently rotating turntable, the electronic parts being delivered from a parts supply portion, said parts suctioned and held by said suction nozzles, said electronic parts being transferred, positioned and mounted on a print substrate placed on an X-Y table by the intermittent rotation of said turntable, said apparatus being provided with part adjusting means for subjecting the electronic parts suctioned and held by said suction nozzles, to various stepwise adjusting means at a plurality of working stations through which the suctioned parts pass during transfer of the part to the print substrate, at least one of said part adjusting means comprising a base disposed adjacent the working stations, a plurality of positioning working units arranged in succession on said base, said working units being slidably movable in an arrangement direction, a plurality of positioning pawls disposed on each positioning working unit and having different sizes and shapes, and, moving means for reciprocating said plurality of positioning working units in their arrangement direction; the movement direction of said working units intersecting the direction of movement of said suction nozzles through intermittent rotation of said turntable at each working station; said positioning working units positioning the electronic parts by the positioning pawls of the working unit which is selectively positioned under the selected working station.

2. The electronic parts automatic mounting apparatus according to claim 1, wherein said part adjusting means comprises means for detecting presence or absence of suction of electronic parts onto said suction nozzles prior to positioning of electronic parts, and means for detecting presence or absence and attitude of electronic parts onto said suction nozzles after positioning of electronic parts.

3. The electronic parts automatic mounting apparatus according to claim 1, wherein said part adjusting means comprises a part-rotating working means separately from the positioning working station for the electronic parts.

4. The electronic parts automatic mounting apparatus according to claim 1, wherein said suction nozzle is held by means of a holder, said holder being synchronized with the rotation of a turntable so that the holder may be moved upward and downward.

5. The electronic parts automatic mounting apparatus according to claim 1, including means for positioning said suction nozzles.

6. The electronic parts automatic mounting apparatus according to claim 1, including means, at a separate station, for rapidly moving the suction nozzles, the moving means having a vertical rail for guiding the suction nozzles.

7. The electronic parts mounting apparatus of claim 1, further comprising a frame which moves linearly to said base, said plurality of positioning working units arranged on said frame, and, moving means for moving said frame.

8. The electronic parts mounting apparatus of claim 7, wherein said moving means comprises a reciprocating cylinder.

9. The electronic parts mounting apparatus of claim 8, wherein a stopper is provided for setting a stop position of said frame, such that the center of said suction nozzle is registered with a center of a selected one of said plurality of positioning working units.

10. The electronic parts mounting apparatus of claim 8, further comprising a driving motor for rotating said plurality of positioning working units, said driving motor provided on said frame so as to change the rotational position of said positioning units in accordance with the mounting direction of said electronic parts.

* * * * *